United States Patent [19]

Scovell et al.

[11] Patent Number: 4,849,364

[45] Date of Patent: Jul. 18, 1989

[54] SEMICONDUCTOR DEVICES

[75] Inventors: Peter D. Scovell, Chelmsford; Peter F. Blomley, Bishops Stortford; Roger L. Baker, Chelmsford, all of United Kingdom

[73] Assignee: STC PLC, London, England

[21] Appl. No.: 133,270

[22] Filed: Dec. 16, 1987

Related U.S. Application Data

[63] Continuation of Ser. No. 867,492, May 28, 1986, abandoned.

[30] Foreign Application Priority Data

Mar. 23, 1985 [GB] United Kingdom ............... 8507642

[51] Int. Cl.$^4$ .......................................... H01L 21/265
[52] U.S. Cl. .......................................... 437/31; 437/33; 437/228; 437/233; 148/DIG. 10; 357/34; 357/59; 156/653
[58] Field of Search .................. 437/31, 32, 33, 228, 437/225, 233; 148/DIG. 10, DIG. 11; 357/34, 59 H; 156/653, 657

[56] References Cited

U.S. PATENT DOCUMENTS

| | | | |
|---|---|---|---|
| 3,753,807 | 8/1983 | Hoare et al. | 148/DIG. 124 |
| 3,940,288 | 2/1976 | Takagi et al. | 148/DIG. 124 |
| 4,041,518 | 8/1977 | Shimizu et al. | 357/43 |
| 4,188,707 | 2/1980 | Asano et al. | 29/579 |
| 4,301,588 | 11/1981 | Horng et al. | 29/591 |
| 4,437,897 | 3/1984 | Kemlage | 148/188 |
| 4,452,645 | 1/1984 | Chu et al. | 148/DIG. 124 |
| 4,483,726 | 11/1984 | Isaac et al. | 148/187 |
| 4,484,388 | 11/1984 | Iwasaki | 357/43 |
| 4,495,010 | 1/1985 | Kranzer | 29/578 |
| 4,507,847 | 4/1985 | Sullivan | 357/42 |
| 4,523,370 | 1/1985 | Sullivan et al. | 29/571 |
| 4,534,806 | 8/1984 | Magdo | 148/175 |
| 4,563,807 | 1/1986 | Sakai et al. | 148/DIG. 124 |
| 4,604,740 | 8/1986 | Bonn | 357/43 |

FOREIGN PATENT DOCUMENTS

| | | |
|---|---|---|
| 0122004 | 10/1984 | European Pat. Off. |
| 2001800 | 2/1979 | United Kingdom |
| 2126782 | 3/1984 | United Kingdom |
| 2143083 | 1/1985 | United Kingdom |

OTHER PUBLICATIONS

"2 Micron . . . Technology" A. R. Alvarez et al., IEDM, 1984, pp. 761–764.

IEEE Journal of Solid-State Circuits, vol. SC-15, No. 4, Aug. 1980, p. 455–459, IEEE, New York, U.S. H. Nakashiba et al., "An Advanced PSA Technology for High Speed Bipolar LSI".

IEEE Electron Device Letters, vol. EDL-6, No. 6, Jun. 1985, p. 288–290, IEEE, New York, US. M. E. Rowlandson et al., "A True Polysilicon Emitter Transistor".

IEEE Transactions an Electron Devices, vol. ED-31, No. 7, Jul. 1984, p. 853–860, IEEE, New York, US. P. Ashburn et al., "Comparison of Experimental and Theoretical Results on Polysilicon Emitter Bipolar Transistors".

Primary Examiner—Brian E. Hearn
Assistant Examiner—Kevin McAndrews
Attorney, Agent, or Firm—Lee & Smith

[57] ABSTRACT

A method of manufacturing a bipolar transistor (1) with semi-self-aligned p+ base contacts (27,27a). A p-type base region (28) is formed in a surface region of an n-type region 5 comprising a collector. An element (29) of, for example, n+ doped polycrystalline silicon, and comprising an emitter, is formed on the surface in contact with the base region (28). The base contacts (27,27a) are formed by implantation and using the element (29) as a mask. An n+ collector contact (25) is made to the n-tpe region (5).

3 Claims, 4 Drawing Sheets

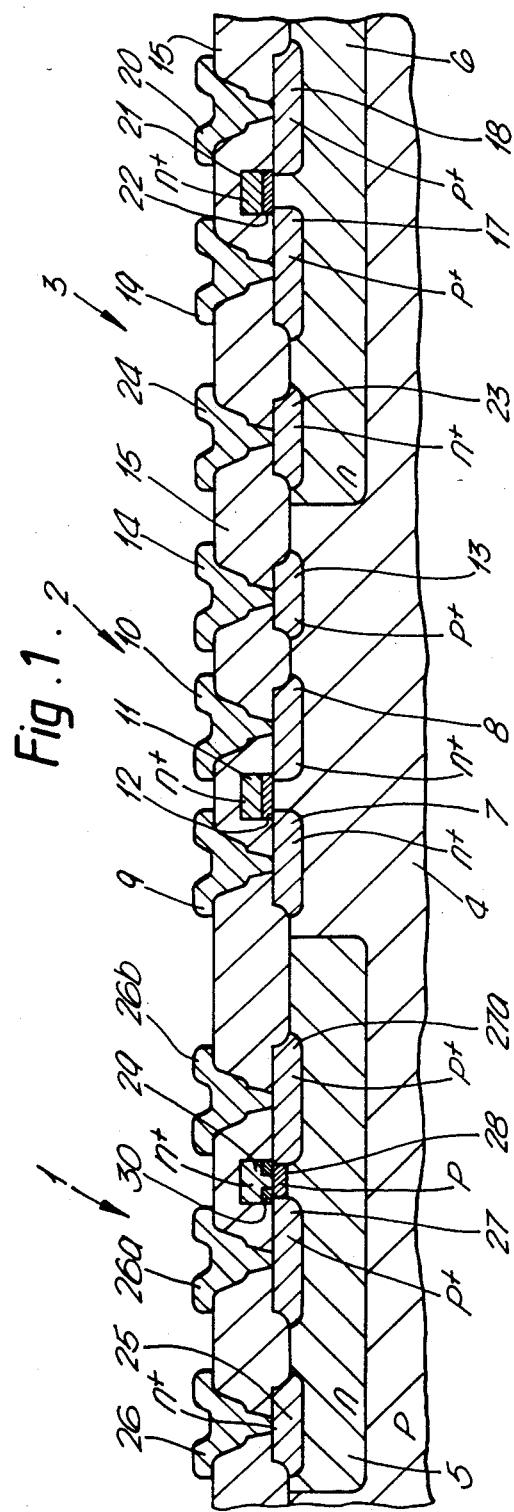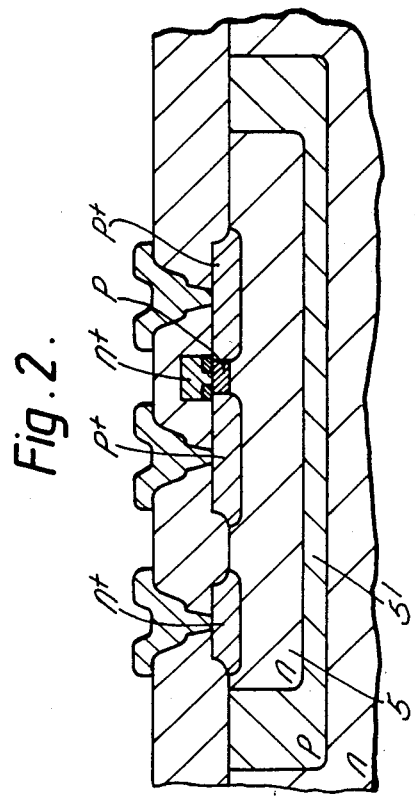

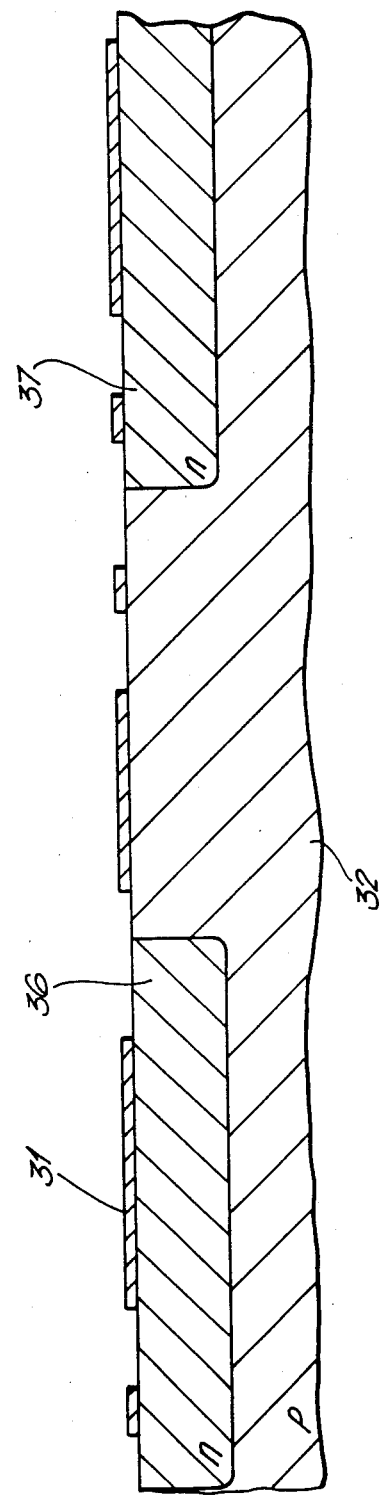
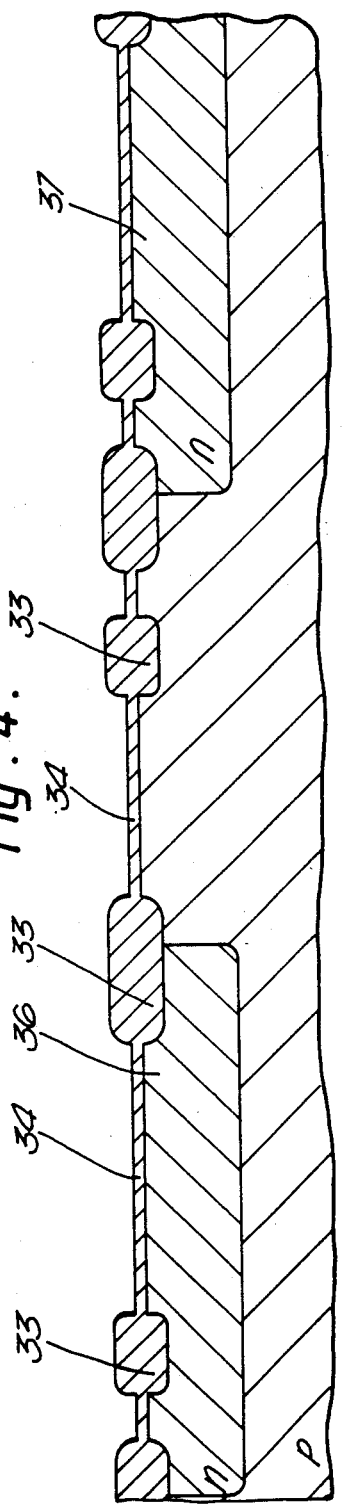

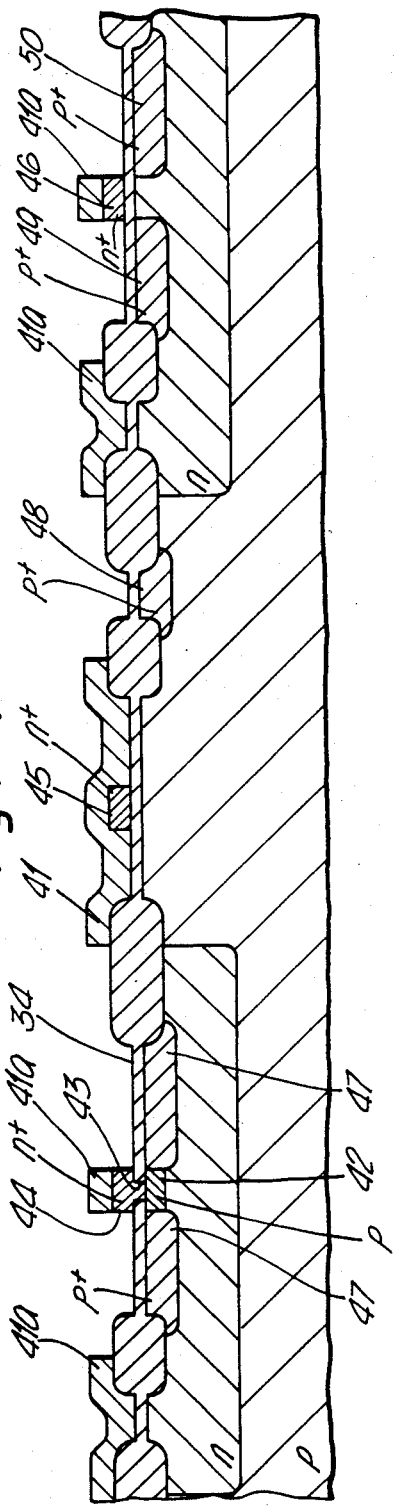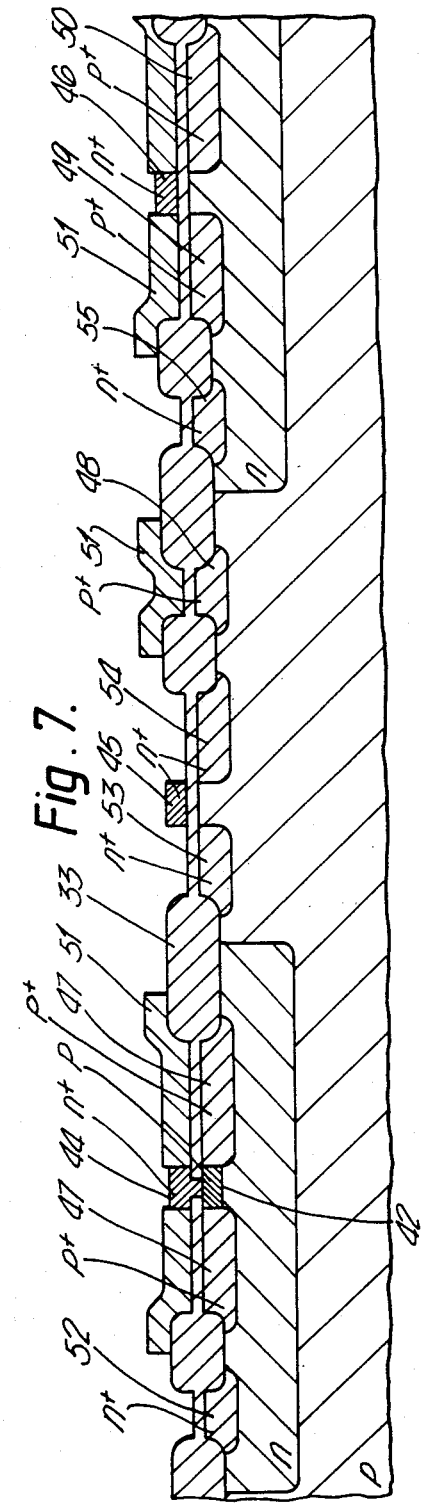

SEMICONDUCTOR DEVICES

This application is a continuation, of application Ser. No. 867,492, filed May 28, 1986, now abandoned.

BACKGROUND OF THE INVENTION

This invention relates to semiconductor devices and in particular bipolar transistors.

SUMMARY OF THE INVENTION

According to the present invention there is provided a method of manufacturing a bipolar transistor with semi-self-aligned base contacts including the steps of forming a base region of one conductivity type in a surface region of the other conductivity type of a silicon substrate, forming an element on the surface and in contact with the base region, the element being doped to be of the other conductivity type and comprising the emitter of the transistor, forming a pair of base contact regions of the one conductivity type in said surface region in contact with the base region and on opposite sides thereof by implantation and using the element as a mask, and forming a collector contact of the other conductivity type in said surface region and spaced apart from the base contact regions.

BRIEF DESCRIPTION OF THE DRAWINGS

Embodiments of the invention will now be described with reference to the accompanying drawings, in which:

FIG. 1 illustrates in cross-section a bipolar/CMOS structure including a bipolar transistor according to one embodiment of the present invention;

FIG. 2 illustrates the bipolar transistor of FIG. 1 formed in a p-well rather than an n-well as illustrated in FIG. 1, and FIGS. 3 to 7 illustrate in cross-section various stages in the manufacture of a bipolar/CMOS structure with n wells.

DESCRIPTION OF THE PREFERRED EMBODIMENTS

Figure 5:
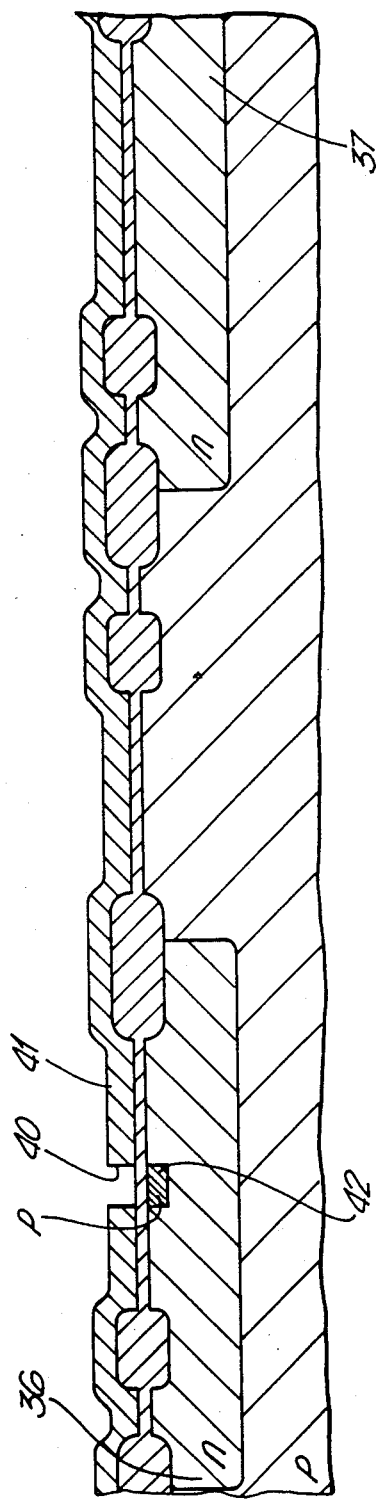

The bipolar/CMOS structure illustrated in FIG. 1 comprises a bipolar transistor 1, an n-channel MOS transistor 2 and a p-channel MOS transistor 3. The transistor 2 is formed directly in a p-type substrate 4, whereas the transistors 1 and 3 are formed in n-wells 5 and 6, respectively, provided in the substrate 4. The n-channel transistor 2 is formed by conventional CMOS processing and includes n+ source and drain regions 7 and 8 respectively, external electrical contacts 9 and 10, provided for example by metallization, to the source and drain regions 7 and 8, a polysilicon gate 11 together with gate oxide 12, a p+ contact 13 to the substrate 4, an external electrical contact 14 to the p+ contact 13, provided for example by metallisation, and isolating oxide 15. The gate 11 is also externally electrically connected by means not shown. The p-channel transistor 3 is also formed by conventional CMOS processing in the n-well 6 and includes p+ source and drain regions 17 and 18, respectively, external electrical contacts 19 and 20, provided for example by metallisation, to the source and drain regions 17 and 18, a polysilicon gate 21 together with gate oxide 22, an n+ contact 23 to be n-well 6, an external electrical contact 24 to the n+ contact 23, provided for example by metallisation, and isolating oxide 15.

As will be appreciated from FIG. 1 the bipolar transistor 1 is very similar in cross-section to the p-channel transistor 3 and can in fact be made in integrated form with the CMOS devices by the addition of only two extra masks to number employed for the standard CMOS process. The bipolar transistor 1 employs the n-well 5 as its collector and has an n+ collector contact 25 thereto and an external electrical contact 26, provided for example by metallization. The base of transistor 1 is comprised by two p+ contact regions 27 and 27a joined by a p bridging region 28 with two external electrical contacts 26a and 26b as illustrated, and the emitter is comprised by an n+ polysilicon region 29, which contacts the p region 28, there also being an external electrical contact (not shown) to the emitter.

The bipolar transistor 1 includes elements equivalent to those of p-channel transistor 3 and manufactured concurrently therewith although the same bipolar structure may be manufactured independently thereof. The two extra masks required for the production of the polysilicon emitter transistor 1 are for defining the implant required to produce the base region 28 and for opening the oxide region 30 to bring the polysilicon into contact with the base region 28. In FIGS. 1 and 2 the gate oxide 12, 22 and the oxide region 30 are indicated separately from the remaining isolating oxide 15 although they are formed concurrently with part of the isolating oxide 15 as will be more apparent from the description of FIGS. 3 to 8.

Thus the bipolar device is fitted directly into n-well CMOS technology, the n-well being used as the collector. For use in a p-well technology an additional n implant, for example phosphorus or arsenic, is needed. This step can be implemented part of the way through the p-well drive in. Due to different thicknesses of oxides in the well and field areas a non-masked implant can be used for the n-well, although a masked implant can alternatively be used. This produces an n-well 5 within the p-well 5' (stacked wells), which again is used as the collector region of the bipolar device, as illustrated in FIG. 2.

The basic processing stages employed to fabricate the structure of FIG. 1 will now be outlined with reference to FIGS. 3 to 8. Using a first mask and photoresist (not shown) n-type wells 36 and 37 are defined in a p-type substrate 32, for example by ion implantation of phosphorous and subsequent driving-in in a conventional manner. Using a second mask (not shown) a layer of silicon nitride 31, or silicon nitride on silicon dioxide, deposited on the surface of the p-type silicon substrate 32 is patterned to distinguish between device areas and areas in which field oxide is to be grown. Areas of nitride 31 are left on the surface of the substrate 32 at positions corresponding to the device areas, as indicated in FIG. 3. Field dopant (not shown) may be implanted into the surface of substrate 32 by use of suitable masking through the windows opened in the nitride layer 31, by for example ion implantation of boron and/or phosphorous. The substrate is then oxidised in order to form field oxide 33 in the windows. The areas of nitride 31 are etched away and the substrate further oxidised in order to obtain thin oxide areas 34 between the thick field oxide areas 33 (FIG. 4). A third mask (not shown) is employed to define a window 40 in a photoresist layer 41 (FIG. 5), through which window p-type dopant, for example boron, is ion implanted to produce a base region 42 for the bipolar transistor. This third mask is one of the additional two masks referred to above. Using a fourth mask (not shown) and an appropriate photoresist layer a window 43 is opened in the thin oxide area covering base region 42. The alignment is not critical as will be apparent from the following. If an interfacial oxide is required for the polysilicon transistor a suitable treatment can be used now. This fourth mask is the other additional mask. The photoresist is removed and a layer of undoped polycrystalline silicon deposited and ion implanted with As or P. It is then patterned to produce a polycrystalline emitter 44 and gates 45 and 46 (FIG. 6). Then with the polysilicon 44, 45 and 46 together with certain areas of the thin oxide, are protected by appropriate patterned photoresist 41 and 41a, p+ dopant for example boron is implanted to provide base contact regions 47 for the bipolar device, the substrate contact 48 for the n-channel MOS transistor and the source and drain regions 49 and 50 for the p-channel MOS transistor. Using a further mask a layer of photoresist 51 is appropriately patterned to define windows whereby an n+ dopant, for example arsenic, is ion implanted to provide collector contact 52 for the bipolar device, source and drain regions 53 and 54 for the n-channel MOS transistor and the well contact 55 for the p-channel MOS transistor (FIG. 7). The photoresist 51 is removed and the wafer is oxidized and a layer of PSG (phosphosilicate glass) deposited to produce an "oxide" layer of the thickness of layer 15 of FIG. 1. Using another mask windows are opened in the oxide for the provision of the requisite electrical contacts to the underlying regions, the thus processed substrate is then, for example, metallized and the metal patterned as appropriate using yet another mask to produce a structure equivalent to FIG. 1. Further masking and processing may be employed as is conventional for threshold tailoring of the n-channel and p-channel MOS transistors.

By using the high efficiency polysilicon emitter structure the doping levels of the base and collector regions of the bipolar transistor can be optimised to produce low base and collector series resistance whilst still achieving a high current gain. This latitude is not available in conventional bipolar transistors.

Whilst the source and drain regions of the CMOS transistors are produced in a fully aligned manner by virtue of the polysilicon gates, the emitter of the bipolar device is only semi self-aligned with the base comprised by regions 42 and 47, although the performance is not affected thereby.

Bipolar transistors with the structure illustrated in FIG. 1 have been manufactured and found to have very high performance.

Whereas polycrystalline silicon is employed in the specific embodiments described above for the bipolar transistor emitter, this is not the only possible material. Other materials may be used provided they have suitable properties. The material may be a conductive material incorporating a source of carriers and a dopant for forming the emitter. Examples of materials which may be used instead of polycrystalline silicon are oxygen doped polysilicon, refractory metals or refractory metal silicides, amorphous silicon (hydrogenated or otherwise).

The doped polycrystalline silicon may be manufactured by a process as described in our co-pending "GB application No. 8604278" (which claims priority from GB Application No. 8504725) (P. D. Scovell - R. L. Baker 11-3), Application No. 8604278 having been published under GB Serial No. 2171844A and being equivalent to U.S. patent application Ser. No. 832043, filed Feb. 19, 1986.

Advantages Provided by the invention

The method of manufacturing a bipolar transistor described above results in a very high performance device. By using the high efficiency polysilicon emitter structure the doping levels of the base and collector regions can be optimised to produce low base and collector series resistance whilst still achieving a high current gain.

We claim:

1. A method of manufacturing a semiconductor device including the following steps performed in the following order:

forming a surface region in a silicon substrate of one conductivity type, the surface region comprising a well of the other conductivity type;

providing an oxide layer on the surface region;

applying a first photoresist layer to said oxide layer and defining a first window in said first photoresist layer whereby to expose a first portion of said oxide layer;

implanting dopant of the one conductivity type through said first portion of said oxide layer via said window and into said well whereby to form a first region of the one conductivity type, and removing said first photoresist layer;

applying a second photoresist layer to said oxide layer and defining a second window is said second photoresist layer whereby to expose a second portion of said oxide layer, which second portion is over said first region, said second window being smaller than said first window, removing said second portion of said oxide layer whereby to expose said first region, and removing said second photoresist layer;

depositing polycrystalline silicon over the oxide layer and said exposed first region, which polycrystalline silicon is doped so as to be of the other conductivity type;

removing the polycrystalline silicon except in the vicinity of said first region and on the oxide layer immediately adjacent thereto whereby to define a polycrystalline silicon element;

protecting the upper surface of the polycrystalline silicon element with a third photoresist layer and forming a pair of spaced-apart second regions of the one conductivity type and more highly doped than the first region by implanting dopant of the one conductivity type into the well on opposite sides of the first region through the oxide layer and using the polycrystalline silicon element as part of an implantation mask therefore, whereby the second regions are self-aligned with sidewalls of the polycrystallien silicon element and bridged by the first region;

removing said third photoresist layer and implanting a further region of the other conductivity type in said well through the oxide layer, which further region is more highly doped than said well and is spaced apart from said first and second regions.

2. A method as claimed in claim 1 further including the step of opening windows in the oxide layer to expose said pair of spaced apart second regions of the one conductivity type and said further region of the other conductivity type, metallizing the structure and patterning the metal to provide metal electrical contacts to the second regions of the one conductivity type and said further region of the other conductivity type.

3. A method as claimed in claim 1 including the step of causing portions of said oxide layer to be thicker than other portions thereof, the implantations being performed through the thinner other portions, and wherein another part of said implantation mask is provided by respective thicker other portions of said oxide layer.

* * * * *